United States Patent
Zhang et al.

(10) Patent No.: US 9,043,193 B2
(45) Date of Patent: May 26, 2015

(54) MANUFACTURING METHOD AND SYSTEM OF TARGET

(75) Inventors: Jikai Zhang, Beijing (CN); Jiyu Wan, Beijing (CN); Hongjiang Wu, Beijing (CN); Seungmoo Rim, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 576 days.

(21) Appl. No.: 13/428,568

(22) Filed: Mar. 23, 2012

(65) Prior Publication Data

US 2012/0245725 A1    Sep. 27, 2012

(30) Foreign Application Priority Data

Mar. 24, 2011  (CN) .......................... 2011 1 0072318

(51) Int. Cl.
G01B 21/18 (2006.01)
C23C 14/34 (2006.01)
H01J 37/34 (2006.01)

(52) U.S. Cl.
CPC ............ *G01B 21/18* (2013.01); *G01B 2210/56* (2013.01); *C23C 14/3414* (2013.01); *H01J 37/3414* (2013.01); *H01J 37/3491* (2013.01)

(58) Field of Classification Search
CPC . C23C 14/3414; G01B 21/18; G01B 2210/56
USPC ........................................................ 703/21
See application file for complete search history.

(56) References Cited

U.S. PATENT DOCUMENTS

| | | | | |
|---|---|---|---|---|
| 5,751,607 A | * | 5/1998 | Ohta ............................... | 703/13 |
| 7,794,616 B2 | * | 9/2010 | Honda et al. ................... | 216/67 |
| 2009/0277779 A1 | | 11/2009 | Sasaki | |

FOREIGN PATENT DOCUMENTS

| CN | 101570852 A | 11/2009 |
|---|---|---|
| CN | 201598328 U | 10/2010 |

OTHER PUBLICATIONS

Second Chinese Office Action dated Jan. 30, 2014; Appln. No. 201110072318.7.

* cited by examiner

*Primary Examiner* — Aniss Chad
(74) *Attorney, Agent, or Firm* — Ladas & Parry LLP

(57) ABSTRACT

The disclosed technology provides a manufacturing method of a target comprising obtaining an initial mass and a residual mass of the target sample, and calculating an etching mass; determining a relative etching depth of the target sample; calculating a relative etching mass based on the etching mass and the relative etching depth; determining a utilization parameter of the target sample based on the relative etching mass and the initial mass of the target sample before being used; and performing a simulation and optimization process on the utilization parameter of the target sample, obtaining target parameters corresponding to a preset value of the utilization parameter, and outputting the target parameters to a manufacturing control center for manufacturing a target. The disclosed technology also provides a manufacturing system of a target.

17 Claims, 2 Drawing Sheets

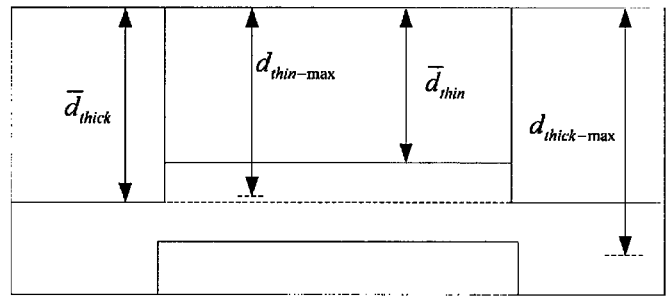
Fig. 4
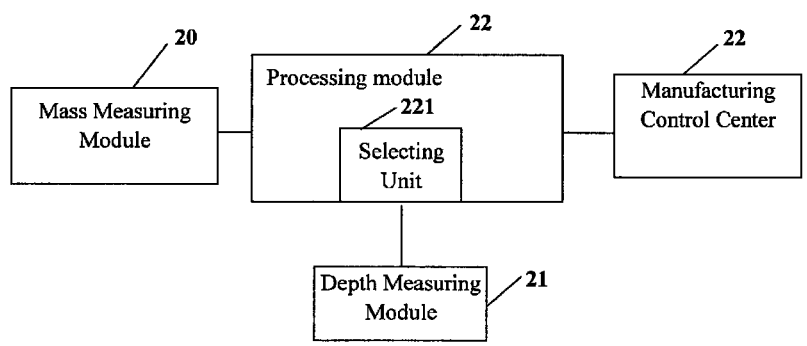
Fig. 5
Fig. 6

MANUFACTURING METHOD AND SYSTEM OF TARGET

BACKGROUND

Embodiments of the disclosed technology relate to a method and a system for manufacturing a target.

With the development of sputtering technology, design on a target (e.g., an indium tin oxide (ITO) target), such as on its thickness, manufacturing process and cost budget and etc., needs a better evaluating criterion.

The generally used equations for calculating a utilization ratio of a target are expressed as follows:

$$TU = \frac{M_s}{M_o} \times 100\% = \frac{M_o - M_t}{M_o} \times 100\% \quad (a)$$

$$\text{or } TU = \frac{V_s}{V_o} \times 100\% = \frac{V_o - V_t}{V_o} \times 100\% \quad (b)$$

In the above equations, $M_o$ is an initial mass of the target before being used, $M_s$ is an etching mass of the target after being etched, $M_t$ is a residual mass of the target after being etched, $V_o$ is an initial volume of the target before being used, $V_s$ is an etching volume of the target after being etched, $V_t$ is a residual volume of the target after being etched. The equation (a) is used in a method in which the mass is measured directly and the utilization ratio is calculated based on the measured mass values, and the equation (b) is used in a method in which the utility is calculated based on the volume.

The existing calculating methods have the following shortcomings. It is very difficult to directly deduce the theoretical calculation equation of the utilization ratio through the volume method since tomography of the surface of the target being sputtered or etched is not regular. In addition, the above methods can not be used to calculate the utilization ratio of a target composed of multiple pieces.

SUMMARY

One embodiment of the disclosed technology provides a manufacturing method of a target comprising obtaining an initial mass of a target sample before being used and a residual mass of the target sample after being etched, and calculating an etching mass by subtracting the residual mass from the initial mass; determining a relative etching depth of the target sample; calculating a relative etching mass based on the etching mass and the relative etching depth; determining a utilization parameter of the target sample based on the relative etching mass and the initial mass of the target sample before being used; and performing a simulation and optimization process on the utilization parameter of the target sample, obtaining target parameters corresponding to a preset value of the utilization parameter, and outputting the target parameters to a manufacturing control center for manufacturing a target.

Another embodiment of the disclosed technology provide a manufacturing system of target comprising a mass measuring module used for obtaining an initial mass of a target sample before being used and a residual mass of the target sample after being etched; a depth measuring module used for obtaining an etching depth of each selected measuring point, and a processing module used for calculating an etching mass by subtracting the residual mass from the initial mass, determining a relative etching depth of the target sample, calculating a relative etching mass based on the etching mass and the relative etching depth, determining a utilization parameter of the target sample based on the relative etching mass and the initial mass of the target sample before being used, performing a simulation and optimization process on the utilization parameter of the target sample, obtaining target parameters corresponding to a preset value of the utilization parameter, and outputting the target parameters to a manufacturing control center for manufacturing a target.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein:

FIG. 4 is a diagram showing etching depth of the splicing target after being used according to the embodiment of the disclosed technology;

FIG. 5 is a diagram of the selected measuring points of a target after being used according to an embodiment of the disclosed technology; and FIG. 6 is a structural diagram of a manufacturing system of target according to an embodiment of the disclosed technology.

DETAILED DESCRIPTION

Figure 1:
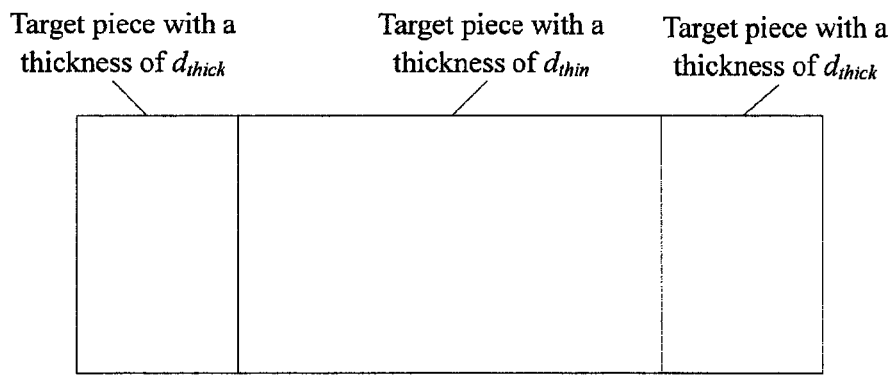
FIG. 1 is a top view of a large-sized splicing target according to an embodiment of the disclosed technology.

Embodiments of the disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

An embodiment of the disclosed technology provides a method of manufacturing a target, which can optimize the production of the target. The present embodiment comprises the following steps.

Step 101: obtaining an initial mass of a target sample before being used and a residual mass of the target sample after being etched through a mass measuring module, and calculating an etching mass by subtracting the residual mass from the initial mass;

Step 102: obtaining a relative etching depth of the target sample;

Step 103: calculating a relative etching mass based on the etching mass and the relative etching depth through a process module;

Step 104: determining a utilization parameter of the target sample based on the relative etching mass and the initial mass of the target sample before being used through the processing module; and Step 105: performing a simulation and optimization process on the utilization parameter of the target sample through the processing module, obtaining target parameters corresponding to a preset value of the utilization parameter, and outputting the target parameters to a manufacturing control center for manufacturing a target.

The simulation and optimization process can be performed based on measured values obtained in one measurement process. Alternatively, multiple times of simulation and optimization processes can be performed corresponding to multiple times of measurement processes.

The target parameters as mentioned above comprise the mass and thickness of the target. The manufacturing method according to the embodiment of the disclosed technology can be applied to a single piece of target or a target composed of multiple pieces. In addition, the relative etching mass in the above steps is a product of the etching mass and the relative etching depth.

(1) When the target sample is a single piece of target, the utilization parameter of the target sample comprises a utilization ratio of the target sample. In this case, the processing module calculates the utilization ratio of the target sample based on the relative etching mass and the initial mass of the target sample before being used.

In particular, the processing module calculates the utilization ratio of the target sample according to an equation (1);

$$TU = \frac{(M_0 - M_1) \times \overline{d}/d_{Max}}{M_0} \times 100\% \quad (1)$$

wherein $M_0$ is an initial mass of the target sample before being used, $M_1$ is a residual mass of the target sample after being used, $\overline{d}$ is an average etching depth of the target sample, and $d_{max}$ is a maximum etching depth. The method for calculating the utilization ratio according to the embodiment of the disclosed technology is performed by combining both the etching mass and the relative etching depth $\overline{d}/d_{max}$ which can reflects the etching uniformity, and it can represents the actual etching status more precisely.

The processing module performs a simulation and optimization process on the utilization parameter of the target sample, determines a set of target parameters corresponding to the preset value of the utilization parameter, and outputs the target parameters to the manufacturing control center for manufacturing the target.

(2) When the target sample is a splicing target composed of a target piece with a first thickness and a target piece with a second thickness, the utilization parameter of the target sample comprises a redundancy rate of the splicing target. The processing module calculates the utilization ratio of the target piece with the first thickness as a first utilization ratio, and calculates the utilization ratio of the target piece with the second thickness as a second utilization ratio. Then, the processing module calculates a ratio of the first utilization ratio to the second utilization ratio, and determines the redundancy rate of the splicing target based on the ratio. In addition, the first utilization ratio and the second utilization ratio are obtained by a calculation process based on the equation (1).

In particular, the processing module calculates the redundancy rate TR of the splicing target according to an equation (2):

$$TR = \left|1 - \frac{TU_{thin}}{TU_{thick}}\right| \quad (2)$$

wherein the first thickness is greater than the second thickness, $TU_{thick}$ is the utilization ratio of the target piece with the first thickness, and $TU_{thin}$ is the utilization ratio of the target piece with the second thickness. The redundancy rate according to the embodiment of the disclosed technology is defined as the above equation (2), which can reflect the utilization status of the splicing target composed of target pieces with different thicknesses. Smaller value of the redundancy represents closer utilization ratios between the target pieces.

The processing module performs a simulation and optimization process on the redundancy rate of the target sample, determines a set of target parameters corresponding to a minimum value of the redundancy rate, and outputs the target parameters to the manufacturing control center for manufacturing the target. The target parameters for the splicing target comprise masses and thicknesses of each target pieces for constituting the splicing target.

Determining the relative etching depth by the processing module comprises the following steps:

1. selecting more than one measuring points on the target by a selecting unit;
2. obtaining the etching depth of each measuring point by a depth measuring module;
3. calculating an average value of the etching depths of all the measuring points by the processing module as an average etching depth of the target, and taking the maximum value of the etching depth of all the measuring points as the maximum etching depth;
4. determining the relative etching depth of the target by the processing module based on the average etching depth and the maximum etching depth.

In the above solution of the present embodiment, the etching depth and mass which can be obtained precisely are used to calculate the utilization parameter of the target, so that the utilization parameter of the target reflects the utilization status of the target more accurately and are suitable for the practical production, which solves the problem that the utilization ratio of the target can not reflect the utilization status. In addition, the disclosed technology can produce the target according to the target parameters obtained by the simulation and optimization process, which further optimizes the production of the target.

Hereinafter, a splicing target is taken as an example to further explain the manufacturing method of the target according to the disclosed technology.

Figure 2:
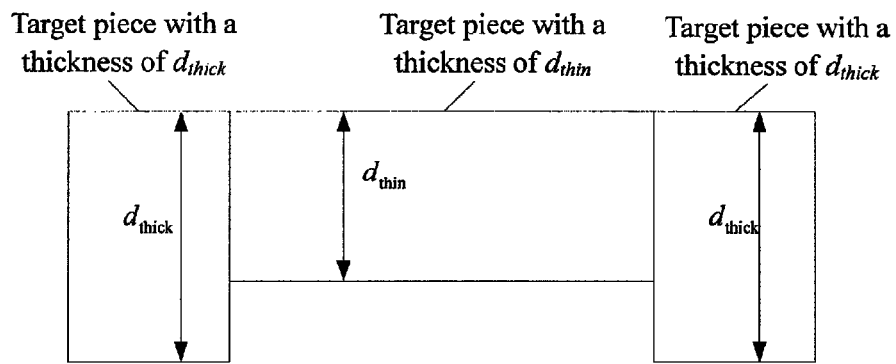
FIG. 2 is a front view of the large-sized splicing target according to embodiment of the disclosed technology.
Figure 3:
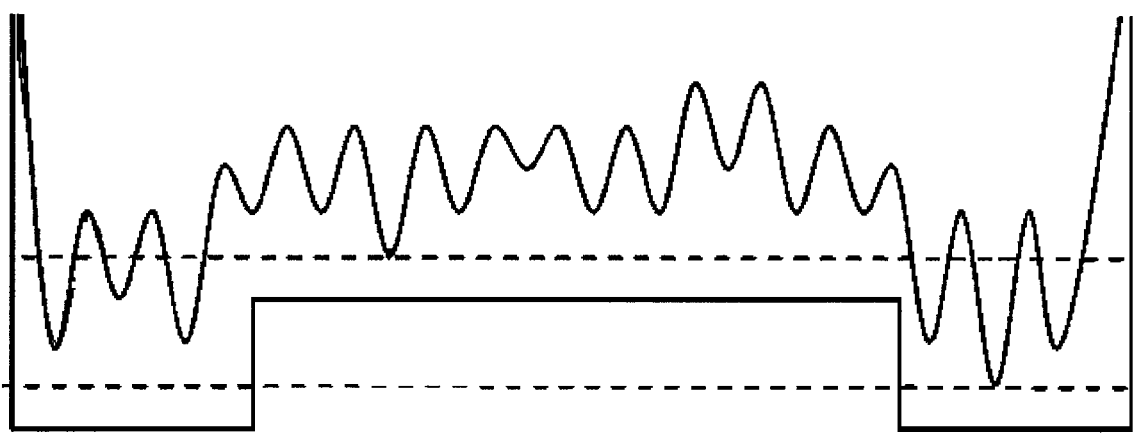
FIG. 3 is a diagram of the large-sized splicing target after being used according to the embodiment of the disclosed technology.

In the industry of thin film transistor liquid crystal displays (TFT-LCDs), it is a trend to make the panel size larger, and thus the size of target for sputtering indium thin oxide (ITO) is required to be increased, too. However, it is hard to produce a large sized target as a whole piece and the manufacturing cost is high. Therefore, it needs to adopt a form of splicing target. FIG. 1 is a top view of a large-sized spicing target, and the target is composed of target pieces with two different thicknesses. The target is designed so that the two side portions of the target are thick and the middle portion is thin. The sputtering uniformity at the two sides of a rectangular magnetic controlling target is different from that at the middle portion, and the magnetic field at the two sides is high and the etching rate there is high accordingly. FIG. 2 is a front view of the large-sized spicing target. As can be seen from FIG. 2, the spicing target of the present embodiment is composed of target pieces with two different thicknesses, and the thickness of the target pieces at the two sides is larger than that of the target piece at the middle portion. During the sputtering process of the target, due to the non-uniform distribution of the magnetic field, the etching amount across the whole target is not uniform, thus it is needed to keep a safe etching depth. FIG. 3 is a diagram showing a surface morphology of the large-sized spicing target after being used.

First, the processing module can perform independent calculations on the utilization ratio of each of the target pieces with different thicknesses by using equations (3) and (4), wherein the target pieces of the same thickness may be regarded as a whole piece in calculating the utilization ratio:

$$TU_{thin} = \frac{(M_{thin-0} - M_{thin-1}) \times \overline{d}_{thin}/d_{thin-Max}}{M_{thin-0}} \times 100\% \quad (3)$$

$$TU_{thick} = \frac{(M_{thick-0} - M_{thick-1}) \times \overline{d}_{thick}/d_{thick-Max}}{M_{thick-0}} \times 100\% \quad (4)$$

In the above equations (3) and (4), $M_{thick-0}$, $M_{thick-1}$, $\overline{d}_{thick}$, $d_{thick-max}$ are an initial mass, a residual mass, an average etching depth and a maximum etching depth of the target piece with the first thickness, respectively; $M_{thin-0}$, $M_{thin-1}$, $\overline{d}_{thin}$, $d_{thin-max}$ are an initial mass, a residual mass, an average etching depth and a maximum etching depth of the target piece with the second thickness, respectively. Each mass parameter may be obtained by a mass measuring module.

$\overline{d}$ is the average etching depth of the target sample, and $d_{max}$ is the maximum etching depth, $\overline{d}/d_{max}$ is a relative etching depth of the target sample. When the value of $\overline{d}/d_{max}$ becomes more approximate to "1", it indicates that the flatness of the etching of the target is better. FIG. 4 is a diagram of the etching depth of the spicing target.

When the average etching thickness and the maximum etching depth of the target sample are calculated, the measuring points should be first selected on the target. Since the magnetic field at two sides of the target is relatively uniform in intensity than that of the magnetic fields at the middle portion, the measuring points at two sides in the lengthwise direction should be dense, and the measuring points at the middle portion are relative loose. If the selection module adopts the form of densely selected points in the thicker target region at two sides and loosely selected points in the thinner target region at the middle portion, the measuring precision may be improved while the error in the measuring process can be reduced. FIG. 5 is a diagram of the measuring points of the target after being used. The depth measuring module measures the etching depth at each measuring point, and the processing module calculates the average value of etching depths of all measuring points as an average etching depth of the target, and takes the maximum value of the etching depth of all the measuring points as the maximum etching depth of the target sample. In practical applications, the depth measuring module may obtain the etching depth through various methods, such as a measurement by laser.

After the utilization ratios of the target pieces with different thicknesses are calculated, respectively, the redundancy rate of the spicing target may be obtained by the above equation (2).

In the present embodiment, the utilization ratios of the target pieces with different thicknesses are calculated independently with equations (3) and (4) to analysis the etching uniformity of the target; the using relationship between the target pieces with different thicknesses are described with equation (2). Smaller value of TR indicates that the designation of the thickness of the target is much reasonable.

When the spicing target is produced, a simulation and optimization process can be performed on the redundancy rate. When the redundancy rate reaches a minimum value, the various target parameters comprising the mass and thickness of the target can be determined accordingly. These parameters are feed back to the manufacturing control center, so as to design the target by referring to the production experience.

The present embodiment takes a spicing target which is composed of target pieces with two different thicknesses to explain the manufacturing method of the spicing target. In the practical application, the production of the spicing target which is composed of target pieces with three or more thicknesses may be achieved according to the disclosed technology without departing the principle of the disclosed technology. As for the splicing target composed of target pieces with three or more different thicknesses, calculations of redundancy rate can be performed on every two target pieces with different thicknesses, and the simulation and optimization process is performed on all of the obtained redundancy rates to get the target parameters.

In the disclosed technology, since the etching depth and mass which can be obtained precisely are used to calculate the utilization parameter of the target, the utilization parameter of the target reflects the utilization status of the target sample more accurately and are more suitable for the practical production, which solves the problem that the utilization ratio of the target can not reflect the utilization status. In the process of selecting measuring points for etching depth, according to the utility situation of the target in the practical production process, more dense measuring points are selected at the two sides where the thickness of the target is higher, which enhances the precision of the measurement and suppresses the influence of the measuring error. In addition, a concept of redundancy rate of the target is proposed in the embodiments of the disclosed technology, which may comprehensively reflect the utilization status of the large-sized spicing target. Thus, the conventional target production depending only on experience is changed, the problem in the thickness design of the target without a quantified criterion is solved, and the production of the target is optimized.

Another embodiment of the disclosed technology provides a system for manufacturing a target. As shown in FIG. 6, the system comprises a mass measuring module 20, a depth measuring module 21, a processing module 22 and a manufacturing control center 23.

The mass measuring module 20 is used for obtaining an initial mass of a target sample before being used and an etching mass of the target sample after being etched.

The depth measuring module 21 is used for obtaining an etching depth of each selected measuring point.

The processing module 22 is used for calculating an etching mass by subtracting the residual mass from the initial mass, determining a relative etching depth of the target sample, calculating a relative etching mass by using the etching mass and the relative etching depth, determining utilization parameters of the target sample with the relative etching mass and the initial mass of the target sample before being used, performing a simulation and optimization process on the utilization parameters of the target sample, obtaining target parameters corresponding to preset values of the utilization parameters, and outputting the target parameters to the manufacturing control center 23 for manufacturing a target.

The processing module 22 comprises a selecting unit 221. When the processing module 22 determines the relative etching depth of the target sample, the selecting unit 221 selects more than one measuring points on the target sample, and the depth measuring module 21 obtains the etching depth of each measuring point. Subsequently, the processing module 22 calculates the average value of the etching depths of all measuring points as the average etching depth of the target sample, takes the maximum value among the etching depths of all the measuring points as the maximum etching depth, and determines the relative etching depth of the target sample based on the average etching depth and the maximum etching depth.

As for the mass measuring module 20, it can employ various mass measuring elements or devices and its specific form is not particularly limited. As for the depth measuring module 21, it can employ various depth measuring devices such as a laser range finder, and its specific form is not particularly limited. As for the processing module 22 and the manufacturing control center 23, they can employ various processors, micro controller units (MCUs), computers and etc., and their specific forms are not particularly limited. As for the system for manufacturing a target, it can use the equations and calculation methods as described in the manufacturing methods according to the above embodiments, which will not be repeated here.

In the above solution of the present embodiment, the etching depth and mass which can be obtained precisely are used to calculate the utilization parameter of the target sample, so that the utilization parameter of the target reflects the utilization status of the target sample more accurately and are suitable for the practical production, which solves the problem that the utilization ratio of the target can not reflect its utilization status. In addition, the disclosed technology can produce the target according to the target parameters obtained by the simulation and optimization process, which further optimizes the production of the target.

It should be noted that the above embodiments only have the purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A manufacturing method of a target, comprising:
    obtaining an initial mass of a target sample before being used and a residual mass of the target sample after being etched, and calculating an etching mass by subtracting the residual mass from the initial mass;
    determining a relative etching depth of the target sample;
    calculating a relative etching mass based on the etching mass and the relative etching depth;
    determining a utilization parameter of the target sample based on the relative etching mass and the initial mass of the target sample before being used; and
    performing a simulation and optimization process on the utilization parameter of the target sample, obtaining target parameters corresponding to a preset value of the utilization parameter, and outputting the target parameters to a manufacturing control center for manufacturing the target.

2. The manufacturing method of claim 1, wherein determining the relative etching depth of the target sample comprises:
    selecting more than one measuring points on the target sample;
    measuring an etching depth of each measuring point;
    calculating an average value of the etching depths of all the measuring points as an average etching depth of the target sample, and taking the maximum value among the etching depths of all the measuring points as a maximum etching depth; and
    determining the relative etching depth of the target sample based on the average etching depth and the maximum etching depth.

3. The manufacturing method of claim 2, wherein the relative etching mass is a product of the etching mass and the relative etching depth.

4. The manufacturing method of claim 3, wherein the target is a splicing target comprising a target piece with a first thickness and a target piece with a second thickness, the first thickness being larger than the second thickness, and determining the utilization parameter of the target sample based on the relative etching mass and the initial mass of the target sample before being used comprises:
    calculating a utilization ratio of the target piece with the first thickness as a first utilization ratio $TU_{thick}$ according to the following equation;

$$TU_{thick} = \frac{(M_{thick-0} - M_{thick-1}) \times \overline{d}_{thick} / d_{thick-Max}}{M_{thick-0}} \times 100\%$$

calculating a utilization ratio of the target piece with the second thickness as a second utilization ratio $TU_{thin}$ according to the following equation;

$$TU_{thin} = \frac{(M_{thin-0} - M_{thin-1}) \times \overline{d}_{thin} / d_{thin-Max}}{M_{thin-0}} \times 100\%$$

calculating a ratio of the first utilization ratio to the second utilization ratio, and determining a redundancy rate of the spicing target as the utilization parameter based on the ratio,
wherein $M_{thick-0}$, $M_{thick-1}$, $\overline{d}_{thick}$, $d_{thick-max}$ are an initial mass, a residual mass, an average etching depth and a maximum etching depth of the target piece with the first thickness, respectively; $M_{thin-0}$, $M_{thin-1}$, $\overline{d}_{thin}$, $d_{thin-max}$ are an initial mass, a residual mass, an average etching depth and a maximum etching depth of the target piece with the second thickness, respectively.

5. The manufacturing method of claim 4, wherein the redundancy rate of the spicing target is calculated according to the following equation:

$$TR = \left|1 - \frac{TU_{thin}}{TU_{thick}}\right|$$

wherein TR is the redundancy rate of the spicing target.

6. The manufacturing method of claim 5, wherein the target parameters corresponding to a minimum value of the redundancy rate is obtained through the simulation and optimization process.

7. The manufacturing method of claim 1, wherein the utilization parameter of target sample is the utilization ratio of the target sample.

8. The manufacturing method of claim 7, wherein the utilization ratio of the target sample is calculated according to the following equation:

$$TU = \frac{(M_0 - M_1) \times \overline{d}/d_{Max}}{M_0} \times 100\%$$

wherein $M_0$ is the initial mass of the target sample before being used, $M_1$ is the residual mass of the target sample after being used, $\overline{d}$ is the average etching depth of the target sample, and $d_{max}$ is the maximum etching depth.

9. The manufacturing method of claim 8, wherein the target parameters corresponding to a maximum value of the utilization ratio is obtained through the simulation and optimization process.

10. The manufacturing method of claim 1, wherein the target parameters comprise mass and thickness of the target.

11. A manufacturing system of target, comprising a processor and a memory, comprising;
a mass measuring module operating on the manufacturing system of target and configured to be used for obtaining an initial mass of a target sample before being used and a residual mass of the target sample after being etched;
a depth measuring module operating on the manufacturing system of target and configured to be used for obtaining an etching depth of each selected measuring point, and
a processing module operating on the manufacturing system of target and configured to be used for calculating an etching mass by subtracting the residual mass from the initial mass, determining a relative etching depth of the target sample, calculating a relative etching mass based on the etching mass and the relative etching depth, determining a utilization parameter of the target sample based on the relative etching mass and the initial mass of the target sample before being used, performing a simulation and optimization process on the utilization parameter of the target sample, obtaining target parameters corresponding to a preset value of the utilization parameter, and outputting the target parameters to a manufacturing control center for manufacturing the target.

12. The manufacturing system of claim 11, wherein the processing module comprises:
a selecting unit operating on the manufacturing system of target and configured to be for selecting more than one measuring points on the target sample.

13. The manufacturing system of claim 12, wherein the relative etching depth of the target sample is a ratio of an average value $\overline{d}$ of the etching depths of all the measuring points to the maximum value $d_{max}$ among the etching depths of all the measuring points.

14. The manufacturing system of claim 13, wherein the relative etching mass is a product of the etching mass and the relative etching depth.

15. The manufacturing system of claim 13, wherein the utilization parameter is a utilization ratio, and the processing module calculates the utilization ratio of the target according to the following equation:

$$TU = \frac{(M_0 - M_1) \times \overline{d}/d_{Max}}{M_0} \times 100\%$$

wherein $M_0$ is the initial mass of the target sample before being used, $M_1$ is a residual mass of the target sample after being used.

16. The manufacturing system of claim 13, wherein the target is a splicing target comprising a target piece with a first thickness and a target piece with a second thickness, the first thickness being greater than the second thickness, the utilization parameter is a redundancy rate, the processing module calculate the utilization ratio of the target piece with the first thickness as a first utilization ratio $TU_{thick}$ according to the following equation;

$$TU_{thick} = \frac{(M_{thick-0} - M_{thick-1}) \times \overline{d}_{thick}/d_{thick-Max}}{M_{thick-0}} \times 100\%$$

the processing module calculates a utilization ratio of the target piece with the second thickness as a second utilization ratio $TU_{thin}$ according to the following equation;

$$TU_{thin} = \frac{(M_{thin-0} - M_{thin-1}) \times \overline{d}_{thin}/d_{thin-Max}}{M_{thin-0}} \times 100\%$$

the processing module calculates a ratio of the first utilization ratio to the second utilization ratio, and determines a redundancy rate of the spicing target,
wherein $M_{thick-0}$, $M_{thick-1}$, $\overline{d}_{thick}$, $d_{thick-max}$ are an initial mass, a residual mass, an average etching depth and a maximum etching depth of the target piece with the first thickness, respectively; $M_{thin-0}$, $M_{thin-1}$, $\overline{d}_{thin}$, $d_{thin-max}$ are an initial mass, a residual mass, an average etching depth and a maximum etching depth of the target piece with the second thickness, respectively.

17. The manufacturing system of claim 16, wherein the redundancy rate of the spicing target is calculated according to the following equation:

$$TR = \left|1 - \frac{TU_{thin}}{TU_{thick}}\right|$$

wherein TR is the redundancy rate of the spicing target.

* * * * *